(12) United States Patent
Kim et al.

(10) Patent No.: US 12,527,074 B2
(45) Date of Patent: Jan. 13, 2026

(54) SEMICONDUCTOR DEVICE WITH BOOTSTRAP DIODE

(71) Applicant: SK keyfoundry Inc., Cheongju-si (KR)

(72) Inventors: Youngbae Kim, Sejong-si (KR); Nara Jang, Cheongju-si (KR); Gyuri Hong, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 777 days.

(21) Appl. No.: 17/695,937

(22) Filed: Mar. 16, 2022

(65) Prior Publication Data

US 2023/0126337 A1 Apr. 27, 2023

(30) Foreign Application Priority Data

Oct. 21, 2021 (KR) .................. 10-2021-0141059

(51) Int. Cl.
*H10D 84/00* (2025.01)
*H10D 30/01* (2025.01)
*H10D 62/17* (2025.01)
*H10D 64/00* (2025.01)

(52) U.S. Cl.
CPC ....... *H10D 84/153* (2025.01); *H10D 30/0281* (2025.01); *H10D 62/393* (2025.01); *H10D 64/111* (2025.01)

(58) Field of Classification Search
CPC . H10D 84/153; H10D 30/0281; H10D 62/393
See application file for complete search history.

(56) References Cited

U.S. PATENT DOCUMENTS

| | | |
|---|---|---|
| 5,894,156 A | 4/1999 | Terashima et al. |
| 6,600,206 B2 | 7/2003 | Jeon et al. |
| 6,825,700 B2 | 11/2004 | Hano |
| 8,217,487 B2 | 7/2012 | Choi et al. |

(Continued)

FOREIGN PATENT DOCUMENTS

| | | |
|---|---|---|
| KR | 10-2013-0108135 A | 10/2013 |
| KR | 10-2014-0113772 A | 9/2014 |

(Continued)

OTHER PUBLICATIONS

Korean Office Action Issued on Dec. 16, 2022, in counterpart Korean Patent Application No. 10-2021-0141059 (8 Pages in Korean).

*Primary Examiner* — Yara B Green
*Assistant Examiner* — Coralie A Nettles
(74) *Attorney, Agent, or Firm* — NSIP Law

(57) ABSTRACT

A semiconductor device including a bootstrap diode is provided. The semiconductor device comprises a first deep well region and a second deep well region disposed in a substrate; a pinch-off region disposed between the first and second deep well regions and configured to have a depth smaller than depths of the first and second deep well regions from a top surface of a substrate; a first buried layer and a second buried layer respectively disposed in the first and second deep well regions; a P-type source region and a N-type drain region respectively disposed in the first and second deep well regions; and a N-type sink region surrounding the P-type source region, where the N-type sink region has a doping concentration higher than a doping concentration of the first deep well region.

14 Claims, 10 Drawing Sheets

(56) References Cited

U.S. PATENT DOCUMENTS

| | | |
|---|---|---|
| 9,263,438 B2 | 2/2016 | Kim et al. |
| 9,947,786 B2 | 4/2018 | Kim et al. |
| 11,121,253 B2 | 9/2021 | Chung et al. |
| 2010/0271079 A1* | 10/2010 | Choi .................... H03K 17/567 327/108 |
| 2012/0063049 A1* | 3/2012 | Modica ................ H10D 89/601 361/111 |
| 2014/0264586 A1 | 9/2014 | Moon |
| 2016/0071837 A1* | 3/2016 | Lee ........................ H10D 8/043 257/272 |
| 2018/0197991 A1* | 7/2018 | Kim .................... H10D 62/328 |
| 2020/0043801 A1* | 2/2020 | Kim .................... H10D 62/393 |
| 2021/0399087 A1* | 12/2021 | Murukesan ........ H10D 84/0156 |

FOREIGN PATENT DOCUMENTS

| | | |
|---|---|---|
| KR | 10-2016-0029602 A | 3/2016 |
| KR | 10-2016-0119410 A | 10/2016 |
| KR | 10-2019-0118225 A | 10/2019 |
| KR | 10-2224364 B1 | 3/2021 |

* cited by examiner

SEMICONDUCTOR DEVICE WITH BOOTSTRAP DIODE

CROSS-REFERENCE TO RELATED APPLICATIONS

This application claims the benefit under 35 USC § 119(a) of Korean Patent Application No. 10-2021-0141059 filed on Oct. 21, 2021, in the Korean Intellectual Property Office, the entire disclosure of which is incorporated herein by reference for all purposes.

BACKGROUND

1. Field

The following description relates to a semiconductor device with a bootstrap diode.

2. Description of Related Art

A bootstrap circuit may include a diode and a capacitor to instantaneously charge a voltage to the capacitor, and may then apply a sufficient voltage to a gate of a Metal-Oxide-Semiconductor Field Effect Transistor (MOSFET) to turn-on the MOSFET. The Bootstrap diode may have a basically similar structure to a Junction Field Effect Transistor (JFET). The JFET may have N-type source/drain regions and a P-type gate region. If the N-type source region of the JFET is replaced by a P-type source region, the Bootstrap diode structure may be obtained. Both the Bootstrap diode and the JFET may need a pinch-off region to cut off a high voltage output from a drain terminal. It may be challenging to have various pinch-off voltages to satisfy the desires of customers in the JFET or the Bootstrap diode. Achieving a low-level leakage current from the bootstrap diode or JFET may also be challenging.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor device includes a first deep well region and a second deep well region disposed in a substrate, wherein the first deep well region is configured to have a length that is less than a length of the second deep well region, and the first deep well region and the second deep well region are configured to have a same conductivity type; a pinch-off region disposed between the first deep well region and the second deep well region and configured to have a depth smaller than depths of the first deep well region and the second deep well region from a top surface of the substrate; a first buried layer and a second buried layer respectively disposed in the first deep well region and the second deep well region; a P-type source region disposed in the first deep well region, and a N-type drain region disposed in the second deep well region; and a N-type sink region disposed in the first deep well region to surround the P-type source region, wherein the N-type sink region is configured to have a doping concentration higher than a doping concentration of the first deep well region.

The pinch-off region may be configured to have a doping concentration less than doping concentrations of the first deep well region and the second deep well region, and one of groove and a dip may be positioned on a bottom surface of the pinch-off region.

The semiconductor device may include a first body region disposed in the first deep well region to surround the P-type source region; and a P-type buried layer disposed in the second deep well region, and configured to overlap the pinch-off region, and wherein the first buried layer does not vertically overlap the P-type buried layer.

The semiconductor device may include a second body region configured to connect the P-type buried layer; and a P-type doping region disposed in the second body region.

The N-type sink region may be absent in a region adjacent to the pinch-off region.

The semiconductor device may include a P-type isolation region configured to surround the first deep well region, the second deep well region, and the pinch-off region; a third body region disposed adjacent to the P-type isolation well region; and a field plate Poly-Si configured to electrically connect to the third body region.

The semiconductor device may further include a laterally-diffused metal-oxide semiconductor (LDMOS) that may include a third deep well region; a fourth body region contacting the third deep well region; a gate insulating layer disposed on the third deep well region and the fourth body region; a gate electrode disposed over the gate insulating layer; a P-type buried layer disposed in the third deep well region; a source region and a pickup region disposed in the fourth body region; and a drain region disposed in the third deep well region.

In a general aspect, a semiconductor device manufacturing method includes forming a first buried layer and a second buried layer in a substrate; forming a first deep well region on the first buried layer, and forming a second deep well region on the second buried layer, wherein the first deep well region is configured to have a length that is less than a length of the second deep well region; forming a pinch-off region between the first deep well region and the second deep well region, wherein the pinch-off region is configured to have a depth that is less than depths of the first deep well region and the second deep well region from a top surface of the substrate; forming a N-type sink region to contact the first buried layer, wherein the N-type sink region is configured to have a doping concentration higher than a doping concentration of the first deep well region; and forming a P-type source region in the first deep well region and forming a N-type drain region in the second deep well region.

The pinch-off region may be configured to have a doping concentration less than doping concentrations of the first deep well region and the second deep well region, and one of a groove and a dip may be positioned on a bottom surface of the pinch-off region.

The method may include forming a first body region in the first deep well region; and forming a P-type buried layer in the second deep well region, wherein the P-type buried layer is configured to overlap the pinch-off region, and wherein the first buried layer is not vertically overlapped with the P-type buried layer.

The method may include forming a P-type isolation region to surround the first deep well region, the second deep well region, and the pinch-off region; forming a third body region adjacent to the P-type isolation well region; and forming a field plate Poly-Si electrically that is connected to the third body region.

In a general aspect, a semiconductor device includes a diode, including a first deep well region of a first length; a second deep well region of a second length greater than the first length; a first buried layer disposed in the first deep well region, and a second buried layer disposed in the second deep well region; and a pinch-off region disposed between the first buried region and the second buried region, wherein at least one of a forward current of the diode and a pinch-off voltage is varied based on a depth of the pinch-off region.

A doping concentration of the first buried region and the second buried region may be greater than a doping concentration of the first deep well region and the second deep well region.

A depth of the pinch-off region may be less than a depth of the first deep well region and a depth of the second deep well region.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
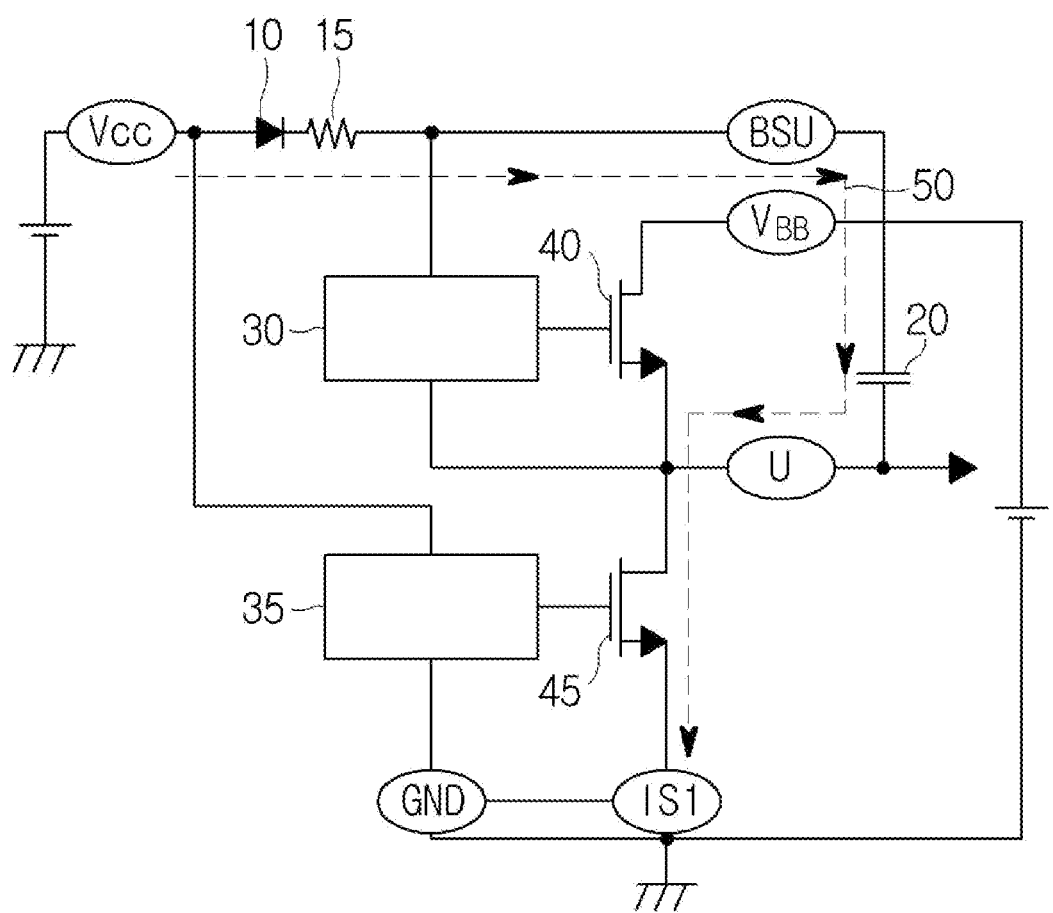
FIGS. 1A and 1B illustrate a typical bootstrap circuit in a semiconductor device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

The terms implemented in this specification are defined in consideration of the functions of a bootstrap diode, semiconductor devices, and a semiconductor device manufacturing method described in the examples. Definitions of the terms disclosed in this specification are applied and terms of which definitions are not described in this specification may be defined as well-known terms and understood and recognized by those skilled in the art.

A semiconductor device implemented throughout this specification may refer, as an example, to a high voltage integrated circuit or a chip which is configured by implementing a semiconductor and may perform specific functions.

Figure 1B:
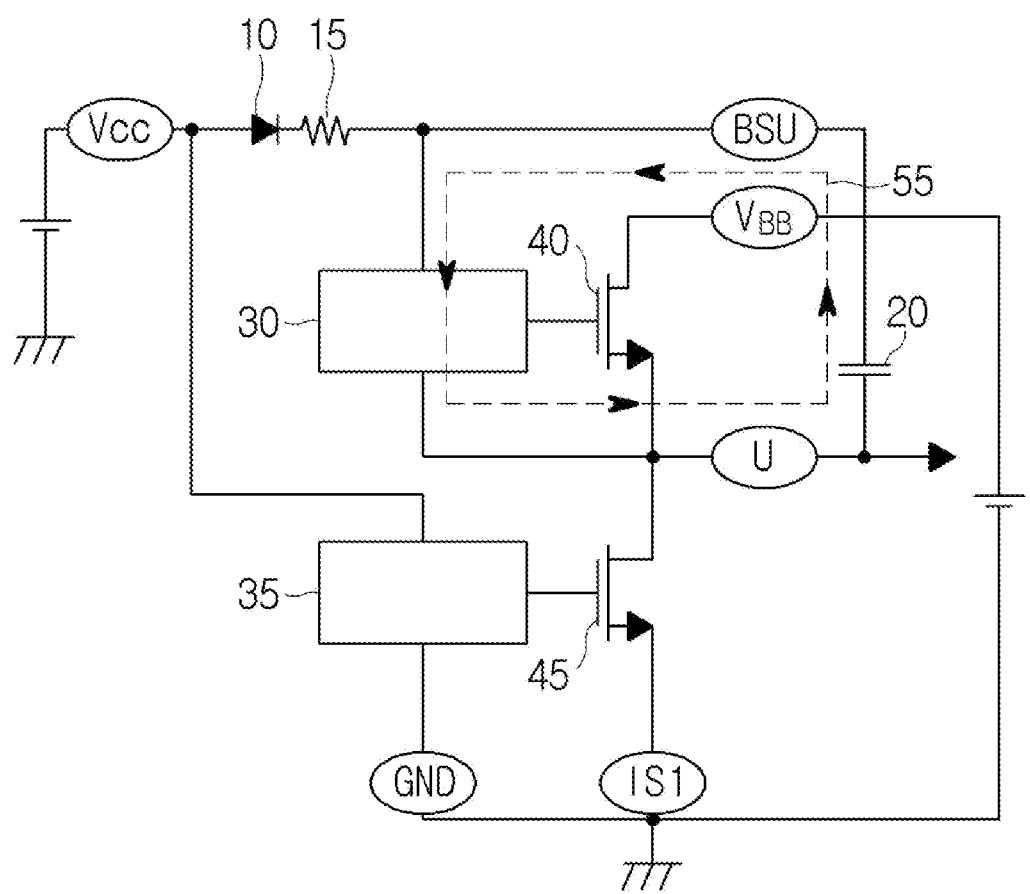

FIGS. 1A and 1B illustrate a typical bootstrap circuit in a semiconductor device.

Referring to FIG. 1A, a typical bootstrap circuit may comprise a bootstrap diode 10, a resistor 15, and a bootstrap capacitor 20. Additionally, the typical bootstrap circuit may comprise a high side MOSFET 40, a low side MOSFET 45, a high side driver 30, and a low side driver 35. If the high side MOSFET 40 turns off and the low side MOSFET 45 turns on, a current path 50 may be obtained and then the bootstrap capacitor 20 may be charged. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Referring to FIG. 1B, if the high side MOSFET 40 turns on and the low side MOSFET 45 turns off, a gate of the high side FET 40 may receive a power voltage from VCC, and a charged voltage from the bootstrap capacitor 20. The bootstrap capacitor 20 may be discharged.

Figure 2:
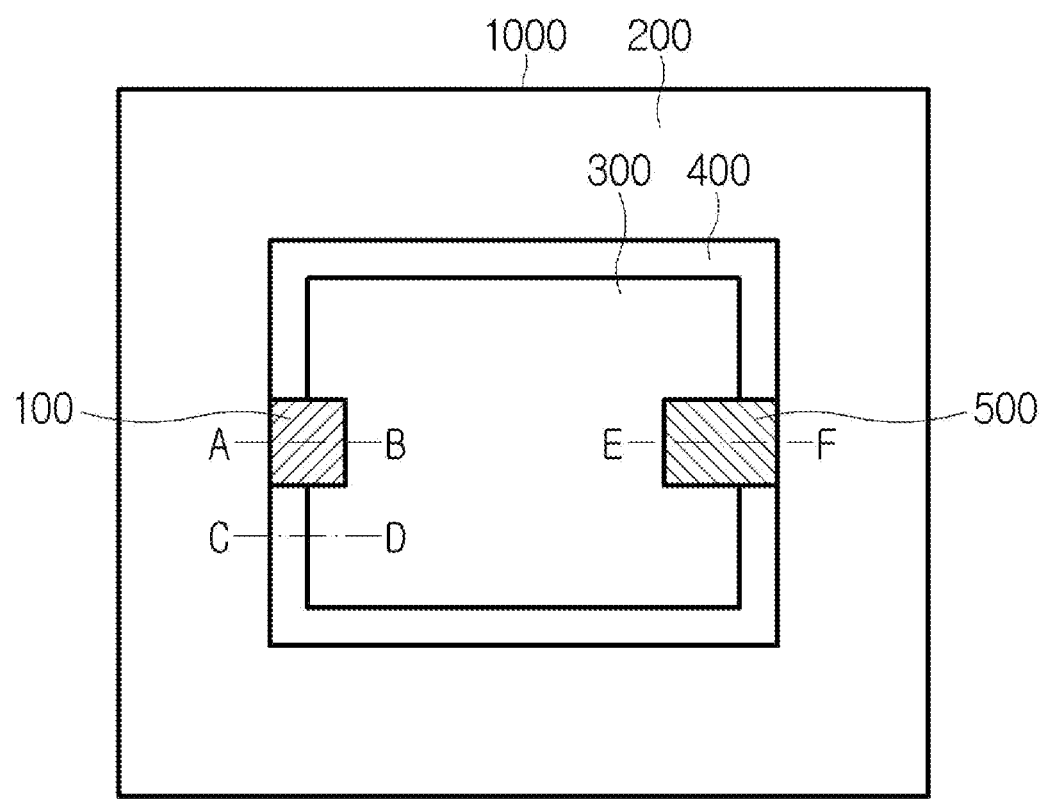
FIG. 2 illustrates a plan view of an example semiconductor device including a diode, in accordance with one or more embodiments.

FIG. 2 illustrates a plan view of an example semiconductor device 1000, in accordance with one or more embodiments.

Referring to FIG. 2, the example semiconductor device 1000 may comprise a diode 100, a low voltage region 200, a high voltage region 300, a junction isolation region 400 disposed between the low voltage region 200 and the high voltage region 300, and a level shift device 500. In a non-limited example, the low voltage region may be operated below 20V, and the high voltage region may be operated from 200V to 1010V. In an example, the diode 100 may be referred to as a bootstrap diode, and the level shift device 500 may be referred to as a LDMOS device.

Figure 3:
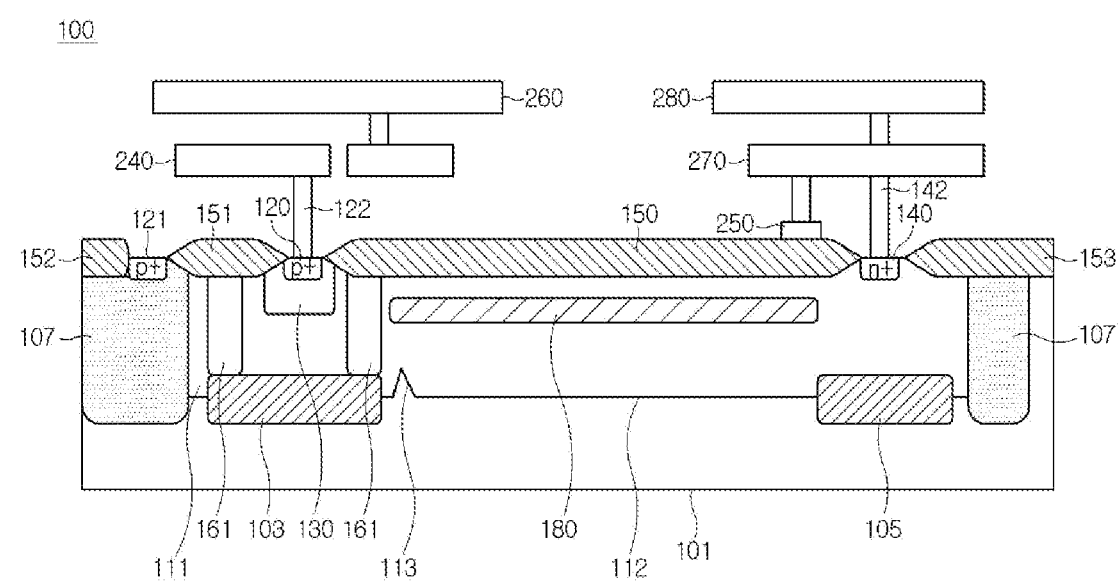
FIG. 3 illustrates a cross-sectional view of an example diode taken along line A-B illustrated in FIG. 2, in accordance with one or more embodiments.

FIG. 3 illustrates a cross-sectional view of an example diode taken along line A-B illustrated in FIG. 2, in accordance with one or more embodiments.

Referring to FIG. 3, the diode 100 may comprise a first buried layer 103, a second buried layer 105, a first deep well region 111, a second deep well region 112, and a pinch-off region 113 disposed in a P-type substrate 101. The first buried layer 103, the second buried layer 105, the first deep well region 111, the second deep well region 112, and the pinch-off region 113 may have N-type. The pinch-off region 113 may be disposed between the first deep well region 111 and the second deep well region 112. The first and second buried layers 103 and 105 may be formed on lower boundary surfaces of the first and second deep well regions 111 and 112, respectively. Each of the first and second buried layers 103 and 105 may have a doping concentration that is higher than a doping concentration of the first and second deep well region 111 and 112.

Referring to FIG. 3, the second deep well region 112 may have a length greater than a length of the first deep well region 111. The greater length of the second deep well region 112 may increase the resistance of the second deep well region 112. Additionally, the pinch-off region 113 may have a depth that is less than depths of the first and second deep well regions 111 and 112. The pinch-off region 113 may be formed by diffusion of the dopants from the first and second deep well regions 111 and 112. The first and second deep well regions 111 and 112 may be formed by ion implantation of N-type dopants. As the ion-implanted N-type dopants diffuse toward each other, the pinch-off region 113 may be formed while forming a concave groove or a dip in the boundary surface between the first and second deep well regions 111 and 112.

A forward current of the diode 100 may depend on a depth of the pinch-off region 113. The forward current may increase with the depth of the pinch-off region 113. A pinch-off voltage may also depend on the depth of the pinch-off region 113. The pinch-off voltage may increase based on the depth of the pinch-off region 113. Various pinch-off voltages and forward current in the diode 100 may be implemented by controlling the depth of the pinch-off region 113. If low pinch-off voltage and low forward current in the diode 100 are desired, the pinch-off region 113 may be implemented to have a smaller depth. A method to control the depth of the pinch-off region 113 will be described in more detail later with reference to FIG. 4.

A P-type buried layer 180 may be formed within the second deep well region 112. The P-type buried layer 180 may overlap with the pinch-off region 113. However, the P-type buried layer 180 may not overlap with the first buried layer 103. The P-type buried layer 180 may be formed in parallel with a first insulating layer 150, and may be spaced apart from a bottom surface of the insulating layer 150 by a predetermined distance. In an example, the P-type buried layer 180 may contact the insulating layer 150. In an example, two or more P-type buried layers 180 may be formed to be spaced apart from each other. The P-type buried layer 180 may increase a breakdown voltage (BV) of the semiconductor device 1000.

Referring to FIG. 3, the diode 100 comprises the P-type source region 120 and the N-type drain region 140 which are respectively formed within the first and second deep well regions 111 and 112. Additionally, the diode 100 may further comprise a first body region 130 formed under the P-type source region 120. The first body region 130 may surround the P-type source region 120. The first body region 130 may reduce a resistance to the forward current. Additionally, the first body region 130 may induce a high breakdown voltage. In a non-limiting example, the breakdown voltage may be 50V or more due to the first body region 130. The first body region 130 may be optional.

Referring to FIG. 3, a parasitic PNP transistor may form the first body region 130, the first deep well region 111 and the P-type substrate 101. Leakage current may occur through the parasitic PNP transistor. In order to block the leakage current, the first buried layer 103 and the N-type sink region (SINK) 161 may be disposed to surround the first source region 120 and the first body region 130. Since the first buried layer 103 and the N-type sink region (SINK) 161 may have higher doping concentration around 1E-19/cm3, the leakage current by the parasitic PNP transistor dose not operate. The N-type sink region 161 may contact the first buried layer 103. The concentrations of the N-type sink region 161 and the first buried layer 103 may be higher than concentrations of the first deep well region 111. Additionally, the N-type sink region 161 may be disposed to be separated from the pinch-off region 113 by a predetermined distance so that the pinch-off voltage would not be affected.

When a forward bias voltage is applied to the P-type source region 120 in the diode 100, a forward current may flow. However, when a reverse bias voltage is applied to the N-type drain region 140, a pinch-off operation by the pinch-off region 113 may occur. A pinch-off voltage may depend on a vertical distance between the P-type buried layer 180 and the P-type substrate 101. Since a groove or a dip may be formed in the pinch-off region 113, the pinch-off operation may easily operate through the pinch-off region 113. The P-type source region 120 and the N-type drain region 140 may be connected to an anode terminal 122 and a cathode terminal 142, respectively. In an example, referring to the circuit illustrated in FIGS. 1A and 1B, the anode terminal 122 may be connected to the VCC terminal which provides power supply to the diode 100 through a first metal wire 240. The cathode terminal 142 may be electrically connected to the bootstrap capacitor 20 through a second metal wire 270. When a forward current is applied to the diode 100, the bootstrap capacitor 20 may be charged.

Referring to FIG. 3, a first insulating layer 150 may be disposed between the P-type source region 120 and the N-type drain region 140 in the diode 100. The first insulating layer 150 may be formed by a local oxidation of silicon (LOCOS) process or by a shallow trench isolation (STI) process. A second insulating layer 151 may be disposed to electrically isolate the P-type source region 120 from the P-type doped region 121. Additionally, third and fourth insulating layers 152 and 153 may be further formed for electrical isolation from another device.

Referring to FIG. 3, the diode 100 may further comprise a first polysilicon field plate 250 disposed on the insulating layer 150. The first polysilicon field plate 250 and the cathode terminal 142 may be electrically connected to each other through the second metal wire 270. The first polysilicon field plate 250 may reduce an electric field. The diode 100 may further comprise third and fourth metal wires 260 and 280. In an example, the third metal wire 260 may be isolated from the anode terminal 122, and may be connected to a ground voltage. Additionally, the fourth metal wire 280 may be connected to the cathode terminal 142 via the second metal wire 270, and may be connected to an external drain power. The third and fourth metal wires 260 and 280 may be disposed to partially overlap the first and second deep well regions 111 and 112. Accordingly, the third and fourth metal wires 260 and 280 may be implemented as the field plate, which may reduce the high electric field mainly distributed on the surfaces of the first and second deep well regions 111 and 112. A P-type isolation region 107 may be disposed to surround the diode 100, or may be disposed at an edge of the diode 100. A P-type doped region 121 may be disposed in an upper portion of the P-type isolation region 107. The diode 100 may be electrically isolated from another device by the P-type isolation region 107.

In order to further improve the characteristics of the bootstrap diode proposed in this specification or in order to facilitate the manufacture of the bootstrap diode, the bootstrap diode may be formed in various structures slightly different from the structure illustrated in FIG. 3.

Figure 4:
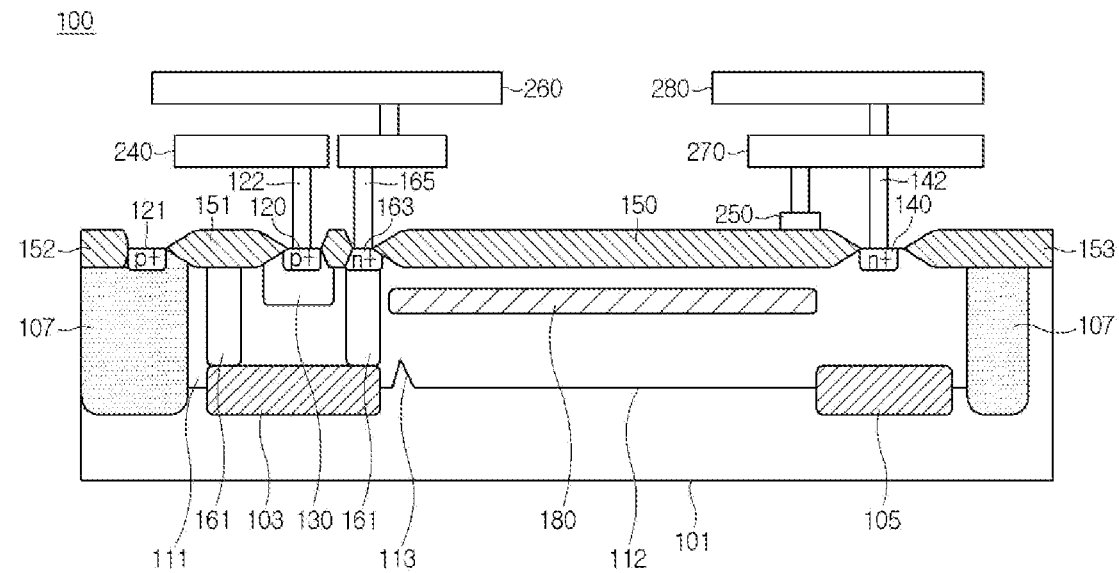
FIGS. 4 to 7 illustrate another cross-sectional view of an example diode, in accordance with one or more embodiments.

FIGS. 4 to 7 illustrate another cross-sectional view of an example diode, in accordance with one or more embodiments Referring to FIG. 4, an N-type doping region 163 may be further disposed on the N-type sink region 161, compared to FIG. 3. Additionally, the N-type sink region 161 and the first buried layer 103 may be connected to a terminal 165 through the N-type doping region 163.

Figure 5:
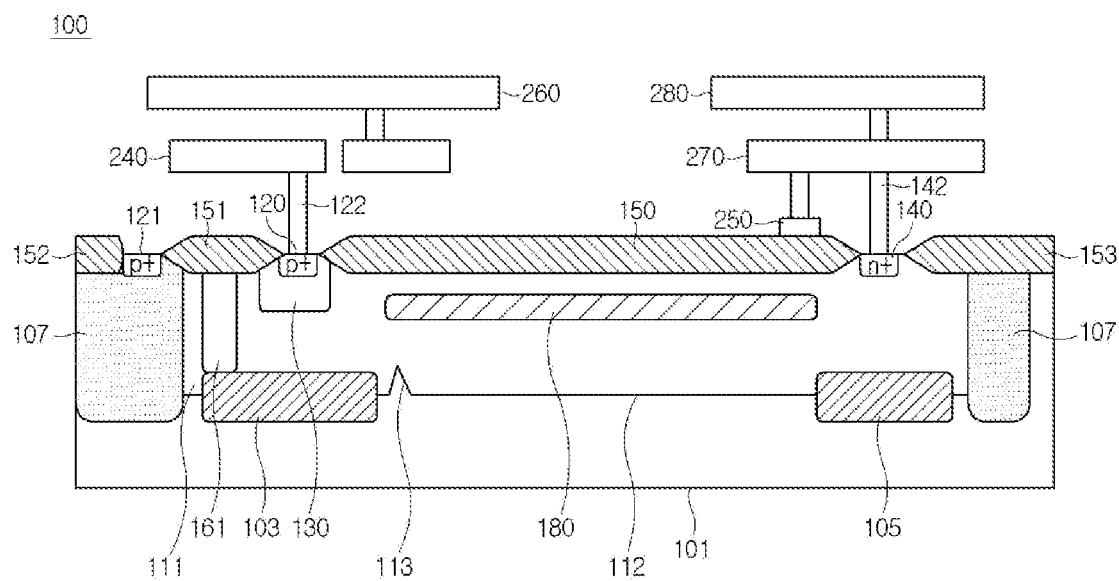

Referring to FIG. 5, one of the N-type sink regions 161 may be removed. Unlike FIG. 3, the N-type sink region 161 may only be disposed on one side of the first body region 130. In an example, the N-type sink region 161 located closer to the pinch-off region 113 may be removed. The first source region 120 and the first body region 130 may be surrounded by the three N-type sink regions 161 except for a portion closer to the pinch-off region 113.

Figure 6:
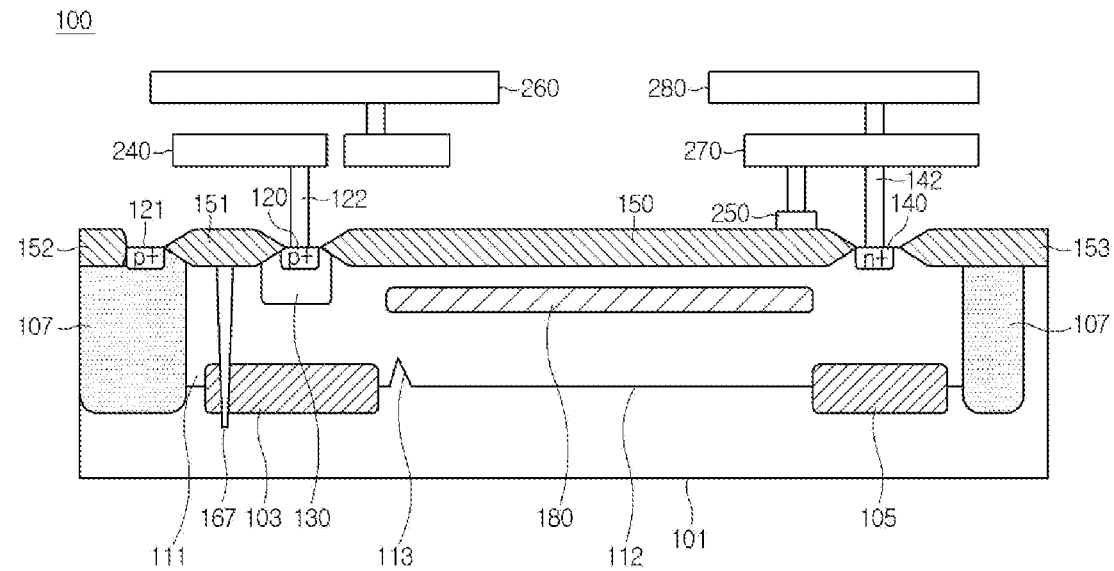

Referring to FIG. 6, a deep trench isolation (DTI) 167 may be implemented instead of the N-type sink region 161. The DTI 167 may only be disposed on one side of the first body region 130. A DTI 167 located closer to the pinch-off region 113 may be removed.

Figure 7:
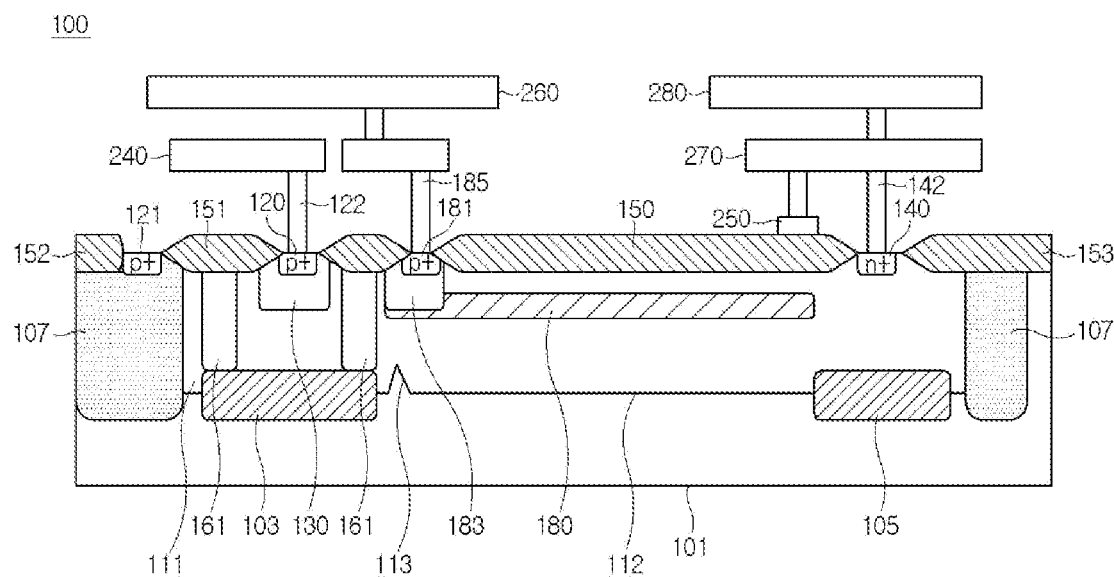

Referring to FIG. 7, a P-type doped region 181, a second body region 183 and a terminal 185 may be further added adjacent to the pinch-off region 113. A ground voltage may be supplied to the terminal 185. The second body region 183 may be electrically connected to the P-type buried layer 180 to supply the ground voltage.

FIGS. 8A to 8D illustrate a manufacturing method for an example diode, in accordance with one or more embodiments.

Figure 8A:
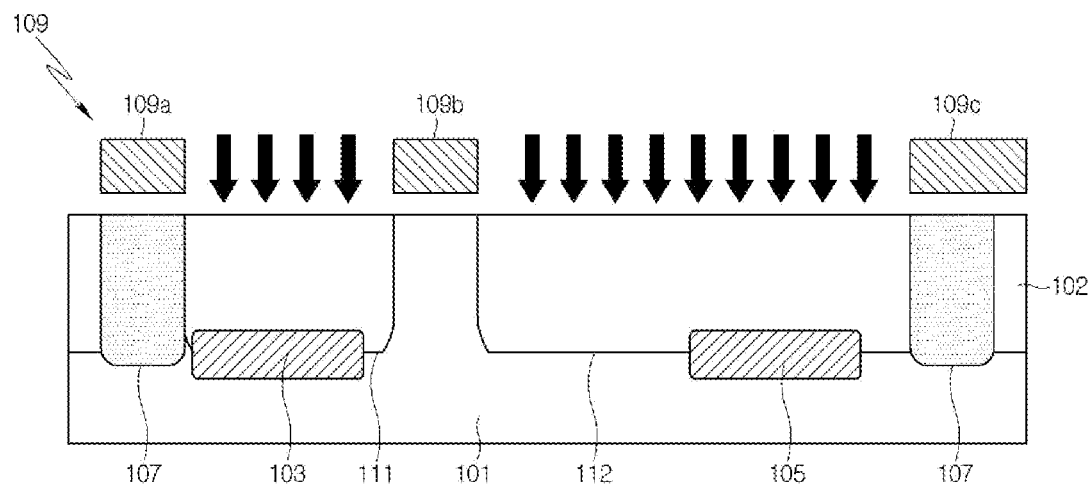
FIGS. 8A, 8B, 8C, and 8D illustrate a diode manufacturing method, in accordance with one or more embodiments.

Referring to FIG. 8A, the first buried layer 103 and the second buried layer 105 may be formed in a substrate 101. A P-type or N-type epi-layer 102 may be respectively grown on the first buried layer 103 and the second buried layer 105. Mask patterns 109 (109a, 109b, and 109c) having a predetermined width may be formed on the P-type or N-type epi-layer 102. An implantation process may be performed to form the first and second deep well regions 111 and 112 using N-type dopants. Then, the first and second deep well regions 111 and 112 may be formed on the respective first and second buried layers 103 and 105. The first deep well region 111 may have a length smaller than a length of the second deep well region 112. A width of the mask pattern 109b may be implemented or disposed such that a space between the first and second deep well regions 111 and 112 may increase. If the space between the first and second deep well regions 111 and 112 increases, a distance between the first and second deep well regions 111 and 112 may be increased. After performing the implantation process, the mask patterns 109a, 109b, and 109c may all be removed.

Figure 8B:
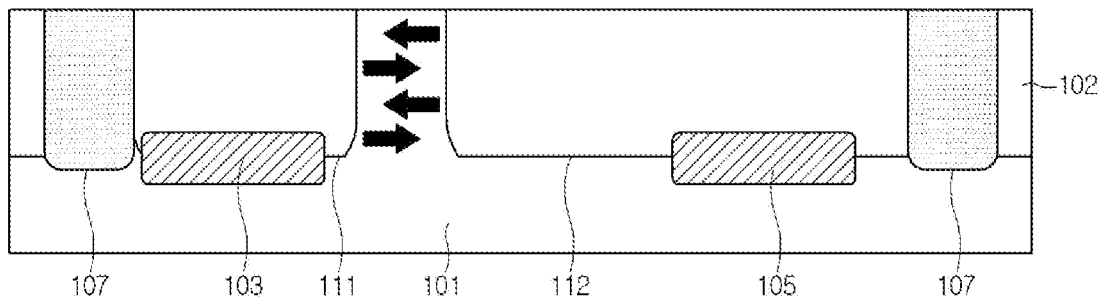

Referring to FIG. 8B, a drive-in annealing process may be performed to form a pinch-off region 113 (FIG. 8C) disposed between the first and second deep well regions 111 and 112. The pinch-off region 113 may be also referred to as a diffused region. N-type dopants in the first and second deep well regions 111 and 112 may be horizontally diffused by the drive-in annealing process. The N-type dopants may be diffused in a direction (see arrows) in which the first and second deep well regions 111 and 112 face each other. If the space between the first and second deep well regions 111 and 112 is increased, the amount of diffused dopants decreases. A depth d1 and dopants concentration of the pinch-off region 113 may be further reduced. This is because as the diffusion area increases, the number of diffused dopants per unit volume decreases. The depth d1 and concentration of the pinch-off region 113 may depend on the width of the mask pattern 109b.

Figure 8C:
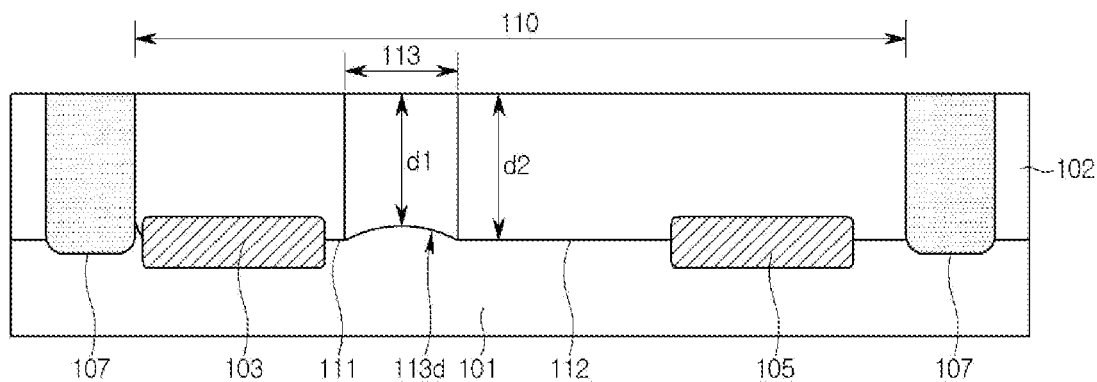

Referring to FIG. 8C, a N-type diffusion region (pinch-off region) 113 may be formed between the first and second deep well regions 111 and 112 after performing the drive-in annealing process. A N-type deep well region 110 may comprise the first and second deep well regions 111 and 112 and N-type diffusion region (pinch-off region) 113. A concave groove or a dip 113d may be formed under the diffusion region 113 by the diffusion process. Since a pinch-off phenomenon may be implemented in the diffusion region 113, this region may be referred to as the pinch-off region 113. This is because, since the diffusion region 113 may have a smaller depth than a depth of the first and second deep well regions 111 and 112, when a reverse bias voltage is applied, a depletion region may first be formed in the diffusion region 113.

If the diffusion region 113 has a smaller width, the diffusion region 113 may have a higher doping concentration and a great depth d1. Accordingly, the pinch-off voltage may increase and the diode 100 may have a higher pinch-off voltage. On the other hand, if the diffusion region 113 has a greater width, the diffusion region 113 may have lower doping concentration and a lower depth d1. Accordingly, the pinch-off voltage may decrease and the diode 100 may have a lower pinch-off voltage. The pinch-off voltage may be controlled by changing the space or the width of the diffusion region 113.

The pinch-off region 113 may have a lower dopant concentration than a concentration of the first and second deep well regions 111 and 112. The depth d1 of the diffusion region 113 may be smaller than, or less than, a depth d2 of the second deep well region 112. A minimum depth of the diffusion region 113 may be obtained from lowermost surface of the diffusion region 113.

Figure 8D:
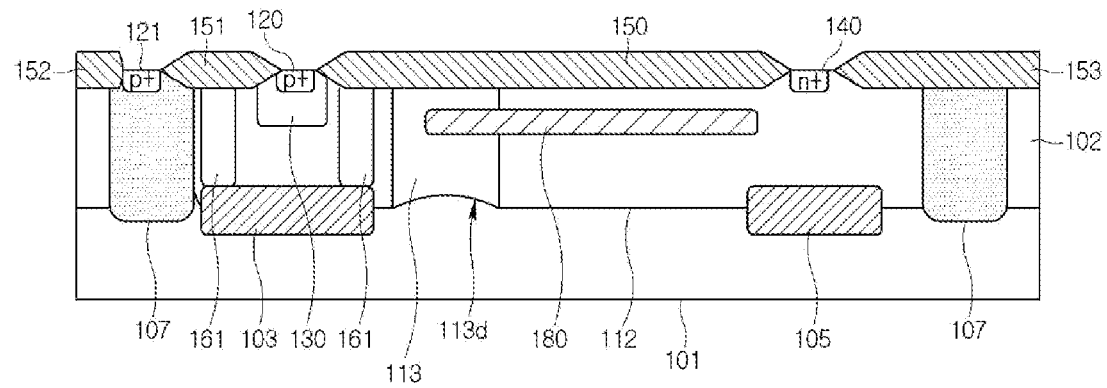

Referring to FIG. 8D, field oxide layers 151 to 153 may be formed on the substrate 101. A N-type sink region 161 contacting the first buried layer 103 may be formed, wherein the N-type sink region 161 may have a doping concentration higher than a doping concentration of the first deep well region 111. A P-type isolation region 107 may be formed to surround the first and second buried layers 103 and 105. A P-type body region 130 and a P-type buried layer 180 may be formed in the respective first and second deep well regions 111 and 112. A P-type source region 120 and a N-type drain region 140 may be formed in the first and second deep well regions 111 and 112, respectively.

Figure 9:
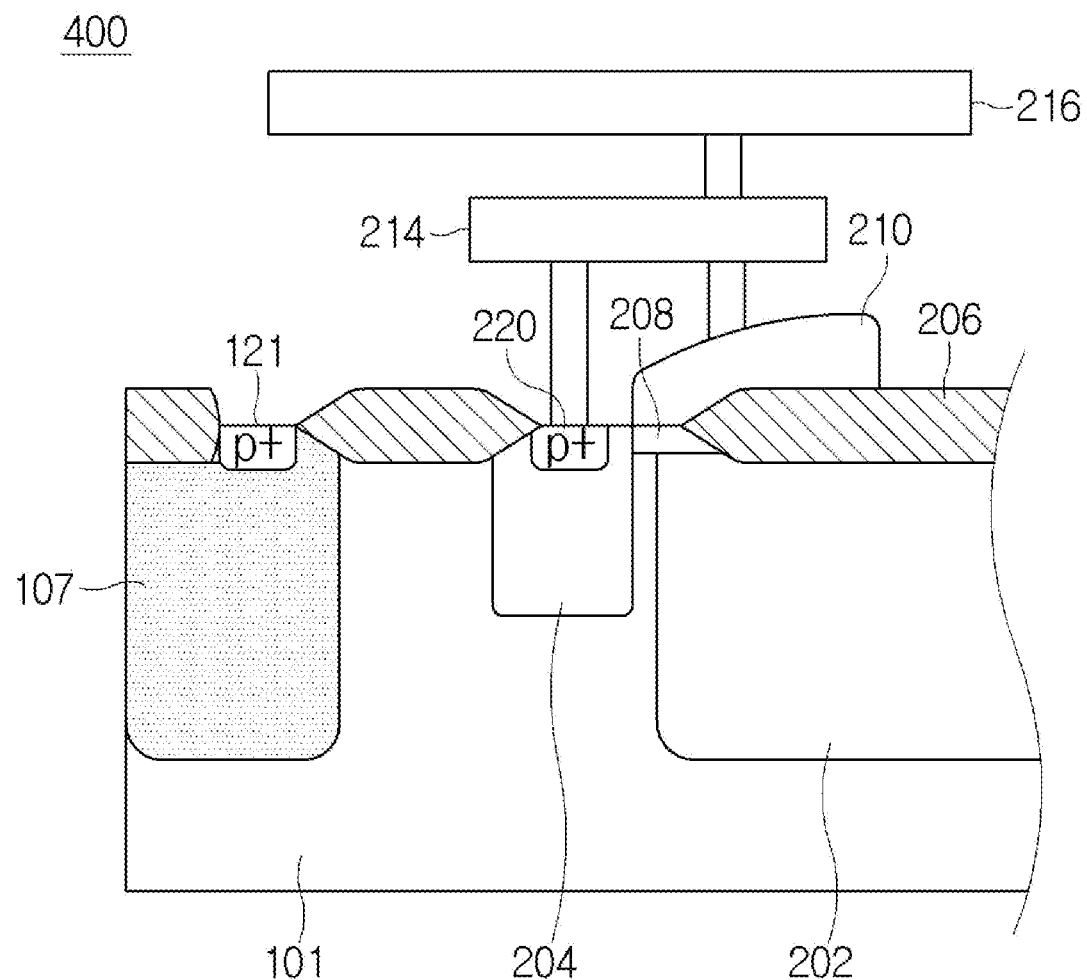
FIG. 9 illustrates a cross-sectional view of a junction isolation region taken along line C-D illustrated in FIG. 2, in accordance with one or more embodiments.

FIG. 9 illustrates a cross-sectional view of a junction isolation region taken along line C-D illustrated in FIG. 2, in accordance with one or more embodiments.

Referring to FIG. 9, the junction isolation region 400 may comprise the P-type isolation region 107, a third body region 204, and a P-type doped region 220. The third body region 204 may be disposed spaced apart from, or in contact with, the P-type isolation region 107. The P-type isolation region 107, the third body region 204, and the P-type doped region 220 may all be electrically connected to each other. Additionally, a high voltage N-type well region 202, an insulating layer 206, an insulating layer 208, and a field plate Poly-Si 210 may be disposed on the substrate 101. In an example, the field plate Poly-Si 210, the P-type doped region 220, and the third body region 204 may be electrically connected to each other through metal wires 214 and 216. Therefore, the field plate Poly-Si may be connected to a source power (ground power) to reduce an electric field. The metal wire 216 may function as a field plate to serve to reduce an electric field.

Figure 10:
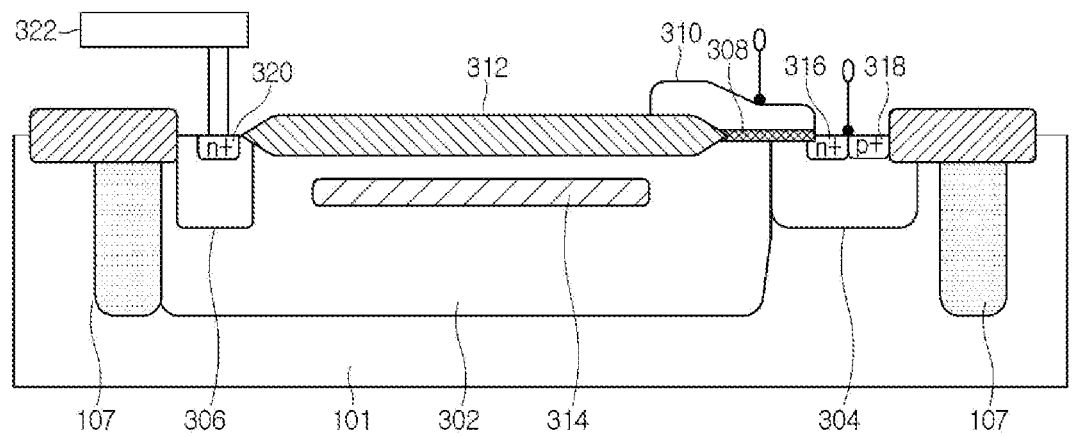
FIG. 10 illustrates a cross-sectional view of a laterally-diffused metal-oxide semiconductor (LDMOS) taken along line E-F illustrated in FIG. 2, in accordance with one or more embodiments.

FIG. 10 illustrates a cross-sectional view of a LDMOS device taken along line E-F illustrated in FIG. 2, in accordance with one or more embodiments.

Referring to FIG. 10, the LDMOS device 500 may be referred to as the level shift device 500, so that the LDMOS device 500 may comprise a third deep well region 302, a fourth body region 304, an N-type well region 306, a gate insulating layer 308, a gate electrode 310, a field oxide layer 312, a P-type buried layer 314, a N-type source region 316, a P-type pickup region 318, a N-type drain region 320, and a metal wire 322. The LDMOS device 500 may be surrounded by the P-type isolation region 107. Leakage current from the LDMOS device 500 to the high voltage region 300 can also be blocked by the P-type isolation region 107.

Advantageous effects that can be obtained from the present disclosure are not limited to the above-mentioned effects. Further, other unmentioned effects can be clearly understood from the following descriptions by those skilled in the art to which the present disclosure belongs.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a diode, a low voltage region, a high voltage region, and a junction isolation region disposed between the low voltage region and the high voltage region, wherein the diode comprises:
   a first N-type buried layer and a second N-type buried layer disposed in a P-type substrate;
   a first deep well region disposed over the first N-type buried layer;
   a second deep well region disposed over the second N-type buried layer;
   an N-type sink region disposed in the first deep well region and in direct contact with the first N-type buried layer;
   a first P-type body region disposed in the first deep well region and laterally surrounded by the N-type sink region;
   a second P-type body region disposed in the second deep well region;
   a first insulating layer in direct contact with the second deep well region;
   a first polysilicon field plate disposed on the first insulating layer;
   a P-type source region disposed in the first P-type body region;
   an N-type drain region disposed in the second deep well region and adjacent to the first polysilicon field plate;
   a first P-type buried layer disposed in the second deep well region between the first N-type buried layer and the second N-type buried layer, and spaced apart from the first insulating layer by a predetermined distance;
   an anode terminal electrically connected to the P-type source region;
   a cathode terminal electrically connected to the N-type drain region;
   a first terminal electrically connected to the second P-type body region;
   a first upper metal wire electrically connected to the first terminal and the second P-type body region, the first upper metal wire extending to overlap with the first deep well region and the second deep well region;
   a first metal wire electrically connected to the anode terminal;
   a second metal wire electrically connected to the cathode terminal and the first polysilicon field plate; and a second upper metal wire electrically connected to the second metal wire, the second upper metal wire extending to overlap with the first polysilicon field plate,
wherein the junction isolation region comprises:
  a P-type isolation region disposed in the junction isolation region and laterally surrounding the first N-type buried layer and the second N-type buried layer;
  a third P-type body region disposed in the junction isolation region and adjacent to the P-type isolation region;
  a second polysilicon field plate disposed adjacent to the third P-type body region;
  a third metal wire electrically connected to the third P-type body region and the second polysilicon field plate; and
  a third upper metal wire electrically connected to the third metal wire, the third upper metal wire extending to overlap with the second polysilicon field plate.

2. The semiconductor device of claim 1, further comprising a pinch-off region disposed between the first deep well region and the second deep well region, wherein the pinch-off region has a depth less than depths of the first and second deep well regions from a top surface of the substrate,
  wherein the pinch-off region has a doping concentration lower than doping concentrations of the first and second deep well regions,
  wherein the pinch-off region comprises a groove or dip formed at a bottom surface thereof, and
  wherein the pinch-off region is located closer to the first N-type buried layer than to the second N-type buried layer.

3. The semiconductor device of claim 1,
  wherein the first P-type buried layer disposed in the second deep well region is located between the first N-type sink region and the second N-type buried layer.

4. The semiconductor device of claim 1, wherein the N-type sink region has a doping concentration greater than doping concentrations of the first and second deep well regions.

5. The semiconductor device of claim 1, further comprising a laterally diffused metal-oxide semiconductor (LDMOS) disposed in the junction isolation region, the LDMOS comprising:
  a third deep well region;
  a fourth P-type body region in contact with the third deep well region;
  a gate insulating layer disposed over the third deep well region and the fourth P-type body region;
  a gate electrode disposed over the gate insulating layer;
  a second P-type buried layer disposed in the third deep well region;
  a source region and a pickup region disposed in the fourth P-type body region; and
  a drain region disposed in the third deep well region.

6. The semiconductor device of claim 1, wherein the first upper metal wire is electrically connected to the second P-type body region through a fourth metal wire, and
  wherein the first upper metal wire extends to overlap with the first N-type buried layer, the N-type sink region, the first P-type body region and the P-type source region.

7. The semiconductor device of claim 1, wherein the third upper metal wire extends to overlap with the P-type isolation region.

8. A method of manufacturing a semiconductor device comprising a diode, a low voltage region, a high voltage region, and a junction isolation region disposed between the low voltage region and the high voltage region,
  wherein the method of forming the diode comprises:
    forming a first N-type buried layer and a second N-type buried layer in a substrate;
    forming a first deep well region over the first N-type buried layer;
    forming a second deep well region over the second N-type buried layer;
    forming an N-type sink region in the first deep well region in direct contact with the first N-type buried layer;
    forming a first P-type body region in the first deep well region and surrounded by the N-type sink region;
    forming a second P-type body region in the second deep well region;
    forming a first insulating layer in direct contact with the second deep well region;
    forming a first polysilicon field plate over the first insulating layer;
    forming a P-type source region in the first P-type body region;
    forming an N-type drain region in the second deep well region and adjacent to the first polysilicon field plate;
    a first P-type buried layer disposed in the second deep well region between the first N-type buried layer and the second N-type buried layer, and spaced apart from the first insulating layer by a predetermined distance;
    forming an anode terminal electrically connected to the P-type source region;
    forming a cathode terminal electrically connected to the N-type drain region;
    forming a first terminal electrically connected to the second P-type body region;
    forming a first metal wire electrically connected to the anode terminal; and
    forming a second metal wire electrically connected to the cathode terminal and the first polysilicon field plate;
    forming a first upper metal wire electrically connected to the first terminal and the second P-type body region, the first upper metal wire extending to overlap with the first deep well region and the second deep well region;
    forming a second upper metal wire electrically connected to the second metal wire, the second upper metal wire extending to overlap with the first polysilicon field plate, and
  wherein the method of forming the junction isolation region comprises:
    forming a P-type isolation region configured to laterally surround the first and second N-type buried layers;
    forming a third P-type body region disposed adjacent to the P-type isolation region;
    forming a second polysilicon field plate disposed adjacent to the third P-type body region;
    forming a third metal wire electrically connected to the third P-type body region and the second polysilicon field plate; and
    forming a third upper metal wire electrically connected to the third metal wire, the third upper metal wire extending to overlap with the second polysilicon field plate.

9. The method of claim 8, further comprising forming a pinch-off region between the first deep well region and the second deep well region, wherein the pinch-off region has a depth less than depths of the first and second deep well regions from a top surface of the substrate, wherein the pinch-off region has a doping concentration less than doping concentrations of the first and second deep well regions, wherein the pinch-off region comprises a groove or dip formed at a bottom surface thereof, and wherein the pinch-off region is located closer to the first N-type buried layer than to the second N-type buried layer.

10. The method of claim 8, wherein the first P-type buried layer formed in the second deep well region is located between the N-type sink region and the second N-type buried layer.

11. A semiconductor device comprising a diode, a low voltage region, a high voltage region, a junction isolation region between the low voltage region and the high voltage region, and a laterally diffused metal-oxide semiconductor (LDMOS);

wherein the diode comprises:
- a first N-type buried layer and a second N-type buried layer disposed in a substrate;
- a first deep well region of a first length disposed over the first N-type buried layer;
- a second deep well region of a second length greater than the first length disposed over the second N-type buried layer;
- an N-type sink region disposed in the first deep well region and in direct contact with the first N-type buried layer;
- a first P-type body region disposed in the first deep well region and surrounded by the N-type sink region;
- a second P-type body region disposed in the second deep well region;
- a first insulating layer in direct contact with the second deep well region;
- a first polysilicon field plate disposed on the first insulating layer;
- a P-type source region disposed in the first P-type body region;
- an N-type drain region disposed in the second deep well region and adjacent to the first polysilicon field plate;
- a first P-type buried layer disposed in the second deep well region between the first N-type buried layer and the second N-type buried layer, and spaced apart from the first insulating layer by a predetermined distance;
- an anode terminal electrically connected to the P-type source region;
- a cathode terminal electrically connected to the N-type drain region;
- a first terminal electrically connected to the second P-type body region;
- a first upper metal wire electrically connected to the first terminal and the second P-type body region, the first upper metal wire extending to overlap with the first deep well region and the second deep well region;
- a first metal wire electrically connected to the anode terminal;
- a second metal wire electrically connected to the cathode terminal and the first polysilicon field plate; and
- a second upper metal wire electrically connected to the second metal wire, the second upper metal wire extending to overlap with the first polysilicon field plate, wherein the junction isolation region comprises:
- a P-type isolation region configured to laterally surround the first and second N-type buried layers;
- a third P-type body region disposed adjacent to the P-type isolation region;
- a second polysilicon field plate disposed adjacent to the third P-type body region; and
- a third metal wire electrically connected to the third P-type body region and the second polysilicon field plate; and
- a third upper metal wire electrically connected to the third metal wire, the third upper metal wire extending to overlap with the second polysilicon field plate.

12. The semiconductor device of claim 11, wherein a doping concentration of the first N-type buried layer is greater than a doping concentration of the first deep well region, and wherein a doping concentration of the second N-type buried layer is greater than a doping concentration of the second deep well region.

13. The semiconductor device of claim 11, further comprising a pinch-off region disposed between the first deep well region and the second deep well region, wherein the pinch-off region has a depth less than depths of the first and second deep well regions from a top surface of the substrate, wherein the pinch-off region has a doping concentration less than doping concentrations of the first and second deep well regions, wherein the pinch-off region comprises a groove or dip formed at a bottom surface thereof, wherein the pinch-off region is located closer to the first N-type buried layer than to the second N-type buried layer, and wherein a first P-type buried layer is disposed in the second deep well region between the first and second N-type buried layers.

14. The semiconductor device of claim 11, further comprising a laterally diffused metal-oxide semiconductor (LDMOS) disposed in the junction isolation region, the LDMOS comprising:
- a third deep well region;
- a fourth P-type body region in contact with the third deep well region;
- a gate insulating layer disposed over the third deep well region and the fourth body region;
- a gate electrode disposed over the gate insulating layer;
- a second P-type buried layer disposed in the third deep well region;
- a source region and a pickup region disposed in the fourth P-type-body region; and
- a drain region disposed in the third deep well region.

* * * * *